US012609010B2

(12) United States Patent
Holm et al.

(10) Patent No.: US 12,609,010 B2
(45) Date of Patent: Apr. 21, 2026

(54) SMART CONDUIT PLUG

(71) Applicant: Rosemount Inc., Shakopee, MN (US)

(72) Inventors: Jacob D. Holm, Savage, MN (US);
Brian M. Affias, Prior Lake, MN (US)

(73) Assignee: Rosemount Inc., Shakopee, MN (US)

( * ) Notice: Subject to any disclaimer, the term of this patent is extended or adjusted under 35 U.S.C. 154(b) by 202 days.

(21) Appl. No.: 18/459,644

(22) Filed: Sep. 1, 2023

(65) Prior Publication Data

US 2024/0112553 A1 Apr. 4, 2024

Related U.S. Application Data

(60) Provisional application No. 63/500,111, filed on May 4, 2023, provisional application No. 63/411,327, filed on Sep. 29, 2022.

(51) Int. Cl.
*G08B 7/06* (2006.01)
*H05K 5/02* (2006.01)
*H05K 1/18* (2006.01)

(52) U.S. Cl.
CPC ............. *G08B 7/06* (2013.01); *H05K 5/0217* (2013.01); *H05K 1/18* (2013.01); *H05K 2201/10098* (2013.01); *H05K 2201/10106* (2013.01); *H05K 2201/10136* (2013.01); *H05K 2201/10151* (2013.01)

(58) Field of Classification Search
CPC .. G08B 7/06; H05K 1/18; H05K 2201/10098; H05K 2201/10106; H05K 2201/10136; H05K 2201/10151
See application file for complete search history.

(56) References Cited

U.S. PATENT DOCUMENTS

| | | | | |
|---|---|---|---|---|
| 8,538,560 | B2 | 9/2013 | Brown et al. | |
| 8,787,848 | B2 | 7/2014 | Kielb et al. | |
| 8,890,678 | B2 | 11/2014 | Holmstadt | |
| 2007/0284112 | A1 * | 12/2007 | Magne ................... | E21B 43/01 |
| | | | | 166/336 |
| 2011/0215944 | A1 * | 9/2011 | Hausler ................. | G01D 11/24 |
| | | | | 340/870.02 |
| 2011/0232793 | A1 * | 9/2011 | Polivka ................ | B25B 21/004 |
| | | | | 29/700 |
| 2012/0293015 | A1 * | 11/2012 | Johnson .................. | G06F 3/147 |
| | | | | 307/117 |
| 2015/0002753 | A1 * | 1/2015 | Perrault ................... | H05K 7/02 |
| | | | | 361/752 |

(Continued)

FOREIGN PATENT DOCUMENTS

| | | | | | |
|---|---|---|---|---|---|
| KR | 20200124393 | A | * 11/2020 | ............... | G01L 7/00 |
| KR | 102296802 | B1 | 9/2021 | | |

OTHER PUBLICATIONS

International Search Report and Written Opinion for PCT Application No. PCT/US2023/074141, Dated Jan. 3, 2024, 11 pages.

*Primary Examiner* — Sisay Yacob

(74) *Attorney, Agent, or Firm* — Christopher R. Christenson; Kelly, Holt & Christenson, P.L.L.C.

(57) ABSTRACT

A smart conduit plug includes a plug body having an externally threaded region and a diameter and thread pitch to engage a conduit port. At least one electrical component is mounted relative to the plug body and is configured to electrically couple to a field device and provide an indication relative to the field device.

21 Claims, 9 Drawing Sheets

(56)  References Cited

U.S. PATENT DOCUMENTS

| 2015/0354998 | A1* | 12/2015 | Hausler | ............... | H05K 7/1462 |
| | | | | | 73/866.5 |
| 2017/0089856 | A1* | 3/2017 | McCoy | ............... | G01N 27/223 |
| 2020/0106864 | A1 | 4/2020 | Denison et al. | | |
| 2022/0337325 | A1* | 10/2022 | Fuller | .................... | H04L 67/12 |

* cited by examiner

418

424

422

422

420

Alarm High Saturation

Alert High Saturation

Alert Low Saturation

Alarm Low Saturation

476

472

470

474

478

SMART CONDUIT PLUG

CROSS-REFERENCE TO RELATED APPLICATION

The present application is based on and claims the benefit of U.S. Provisional Patent Application Ser. No. 63/411,327, filed Sep. 29, 2022, and U.S. Provisional Patent Application Ser. No. 63/500,111, filed May 4, 2023, the content of which provisional applications is hereby incorporated by reference in its entirety.

BACKGROUND

A field device is a device that is couplable to a process, such as a manufacturing or refining process, to support the process by providing one or more functions of measuring and controlling parameters associated with the process. A field device is so named due to its ability to be mounted in the field. "Field" is generally an external area in a process installation that may be subject to climatological extremes, vibration, changes in humidity, electromagnetic or radiofrequency interference, or other environmental challenges. Thus, the robust physical package of such a field device provides it with the ability to operate in the "field" for extended periods (such as years) at a time.

Field devices such as process variable transmitters, are used in the process control and monitoring industry to remotely sense a process variable. Field devices such as actuators, are used by the process control industry to remotely control physical parameters of a process, such as flow rate, temperature, etc. The controller may then transmit control information to a field device such as an actuator to modify a parameter of the process. For example, information related to pressure of a process fluid may be transmitted to a control room and used to control a process such as oil refining.

One environment in which field devices are particularly useful is in process control and monitoring. In such environments, process fluids, such as petrochemicals, slurries, pharmaceutical compounds, and the like may be processed and conveyed to various locations within the processing facility. However, process control and monitoring environments represent a challenge for a number of devices in that the environment itself may have highly flammable or explosive gases present therein. Accordingly, in some such environments, it is important for electronic devices used therein to be housed in an explosion-proof enclosure. When so housed, even if the circuitry of the device generates a spark or has an electrical component with a surface temperature high enough to ignite the environment, the resulting ignition will be entirely contained within the enclosure and not able to escape into the ambient environment. This is important in order to ensure safety of the process control installation and workers therein.

One example of an explosion-proof rating is an ATEX certification to Ex-d standards EN60079-0 and EN60079-1 for potentially explosive atmospheres. Generally, explosion-proof housings are relatively bulky in order to be mechanically robust enough to contain an internal explosion without rupturing. Generally, such explosion-proof containers are very robust metal enclosures that are designed to withstand explosive pressures. These enclosures often include conduit ports for coupling process wiring to the device. When less than all conduit ports of a field device are needed for process wiring, unused conduit ports must be plugged with a conduit plug.

SUMMARY

A smart conduit plug includes a plug body having an externally threaded region and a diameter and thread pitch to engage a conduit port. At least one electrical component is mounted relative to the plug body and is configured to electrically couple to a field device and provide an indication relative to the field device.

DETAILED DESCRIPTION OF ILLUSTRATIVE EMBODIMENTS

One challenge for field devices can sometimes be determining whether the field device is working as expected. In many applications, the field device is installed in the field and connected to the process and to the control system without any sort of feedback that the device is even on, powered, functioning, connected, communicating, and/or measuring on-scale values. Field devices with an LCD screen provide at least some visual feedback to the instrument technician that the field device is powered and functional, but field devices without LCD displays provide no such local feedback to the instrument technician.

Embodiments described herein generally provide a smart conduit plug that uses a form factor (e.g., diameter, thread pitch, et cetera) of a standard conduit plug with some electronics and a glass viewing window to provide an indication of field device status. The smart conduit plug is electrically coupled to the field device terminal block. In one particularly simple embodiment, an LED simply turns on when the field device is receiving power. In another example, the smart conduit plug employs an integrated circuit that is configured to drive the LED state based on a field device analog output. For example, the integrated circuit may cause the LED to display blue if normal and red if the field device is in a high alarm state. A more advanced embodiment includes the provision of a small microcontroller to increase the number of indicated states. The microcontroller that drives the LED could be located on a printed circuit board of the smart conduit plug or could be placed on the field device terminal block PCA's. Some example functions that the smart conduit plug could indicate include, without limitation: powered on status, on and normal operation (process variable within limits), alarms, faults, field device health, no power.

Figure 1:
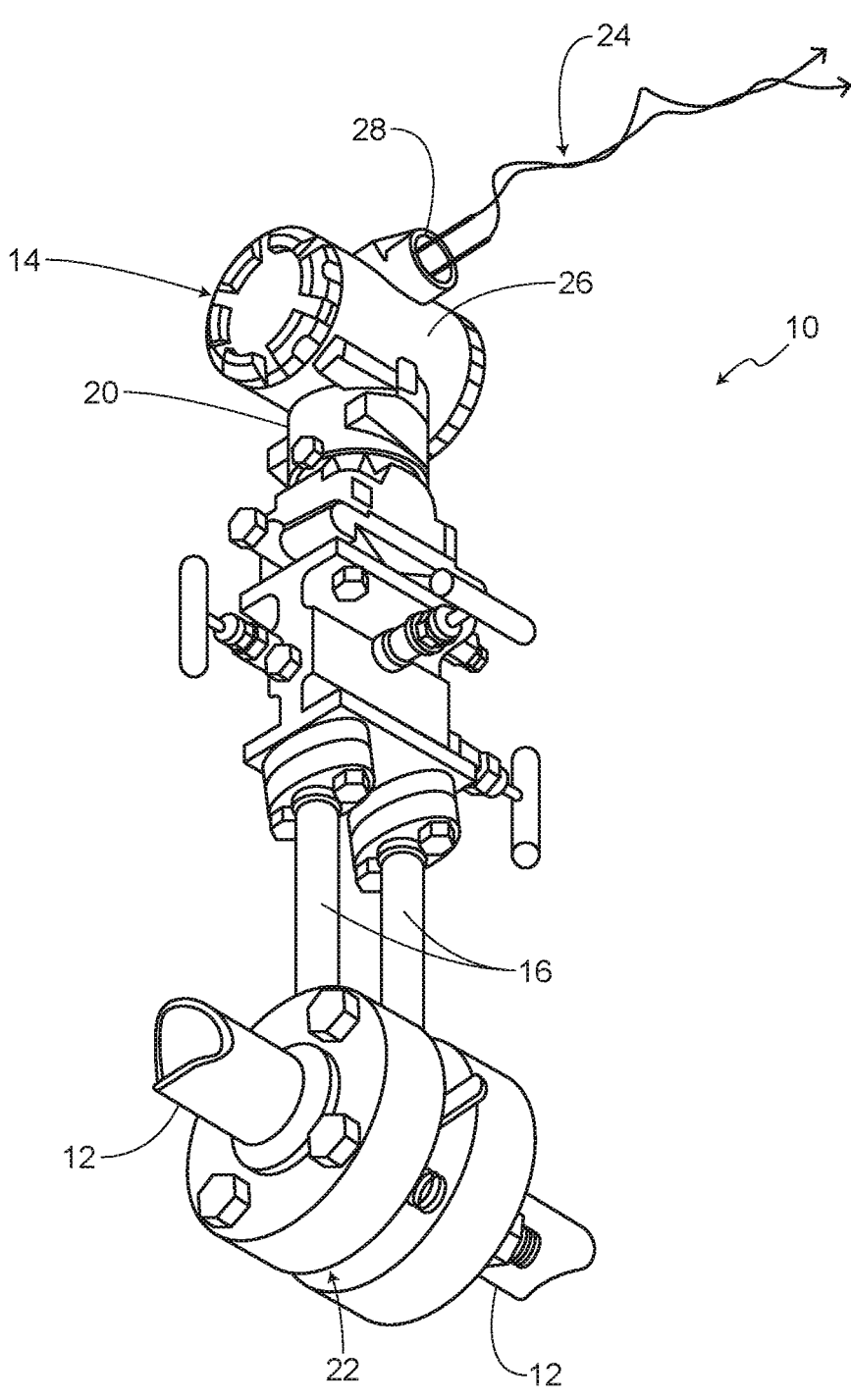
FIG. 1 is a diagrammatic view of a field device with which embodiments described herein are particularly useful.

FIG. 1 is a diagrammatic view of a field device with which embodiments described herein are particularly useful. FIG. 1 generally shows a process measurement environment 10. Process piping 12 contains a fluid under pressure and is coupled to the process measurement system 14 for measuring a process pressure. The process measurement system 14 includes impulse piping 16 connected to process piping 12. The impulse piping 16 is connected to a process pressure transmitter 20. A primary element 22, such as an orifice plate, venturi tube, flow nozzle, and so on, contacts the process fluid at a location in the process piping 12 between the pipes of the impulse piping 16. The primary element 22 causes a pressure change in the fluid as it flows past the primary element 22.

Transmitter 20 is a process measurement device that receives process pressures through the impulse piping 16 and senses a differential process pressure and converts it to a standardized transmission signal representative of flow that is a function of the differential process pressure.

A process loop 24 provides both a power signal to the transmitter 20 from a control room (not shown) and bidirectional communication and can be constructed in accordance with a number of process communication protocols. In the illustrated example, the process loop 24 is a two-wire loop. The two-wire loop is used to transmit all power to and all communications to and from the transmitter 20 during normal operations with a 4-20 mA signal. In another example configuration, loop 24 is a wireless connection in which data may be transmitted or received wirelessly either in a point-to-point configuration, a mesh network, or other configuration.

As shown in FIG. 1, transmitter 20 includes an electronics housing 26 that includes an internally-threaded aperture 28 for receiving a conduit to protect the wiring of process loop 24. Typically, electronics housing 26 will include a pair of such internally-threaded apertures 28.

Figure 2:
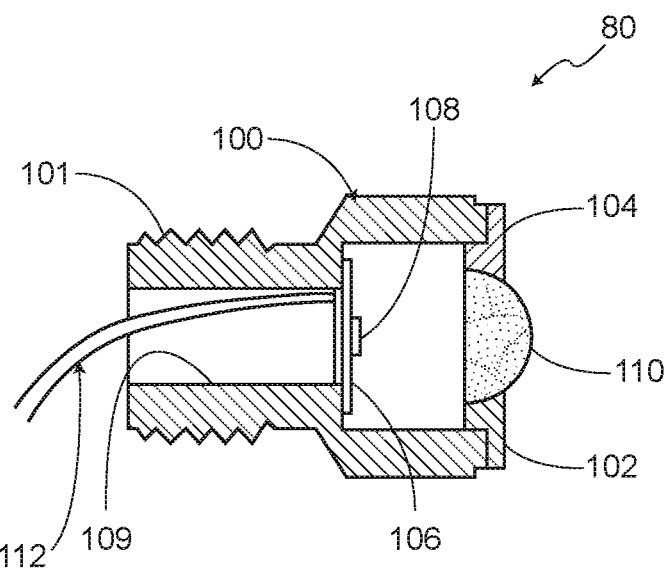
FIGS. 2 and 3 are cross sectional and perspective views, respectively, of a smart conduit plug in accordance with an embodiment of the present invention.
Figure 3:
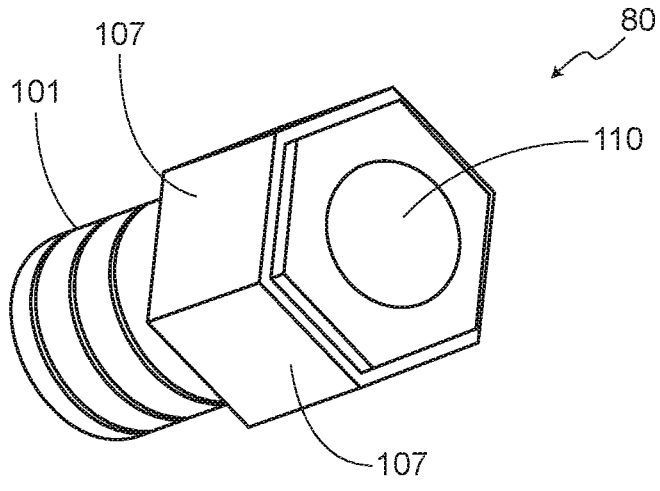

FIGS. 2 and 3 are cross-sectional and perspective views, respectively, of a smart conduit plug 80 in accordance with an embodiment of the present invention. In the illustrated embodiment, conduit plug body 100 includes an externally threaded region 101 that is configured to thread into aperture 28 (shown in FIG. 1). Conduit plug body 100 is welded to a metal-glass header 102 at weld 104. A printed circuit board 106 is disposed within conduit plug body 100 and may be mounted therein in any suitable manner including by plastics, solder, and/or epoxy. In embodiments where maintaining an explosion-proof rating of the field device housing is not required, conduit plug body 100 and header body 104 could simply be formed of plastic. As shown in FIG. 3, the smart conduit plug still includes wrench flats 107 of a standard conduit plug in order to be installed into the field device housing. As shown in FIG. 2, one or more LEDs 108 are disposed on printed circuit board 106 and directed to provide illumination through glass 110. A pair of wires 112 extends from printed circuit board 106 through bore 109 to field device wiring, such as a field device terminal block within the electronics housing (such as electronics housing 26 shown in FIG. 1) of the field device.

Figure 4:
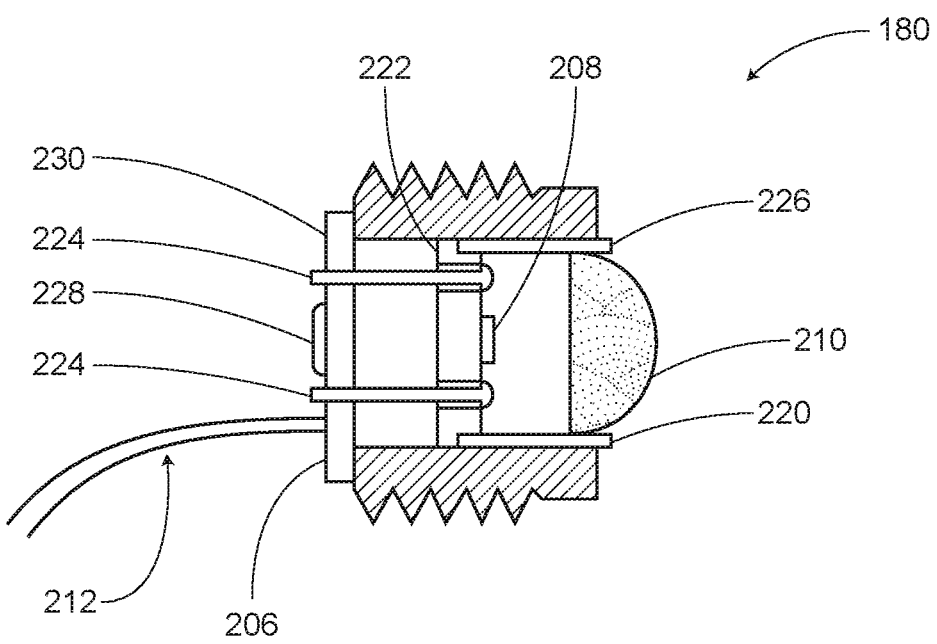
FIGS. 4 and 5 are cross-sectional and perspective views, respectively, of a smart conduit plug in accordance with another embodiment of the present invention.
Figure 5:
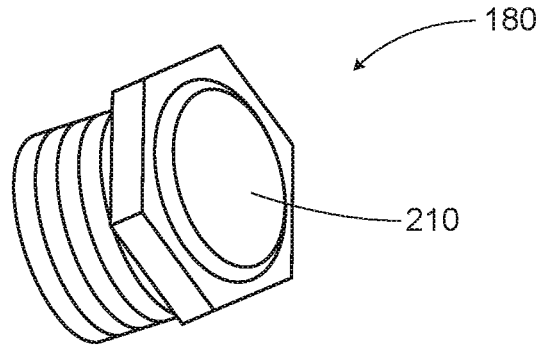

FIGS. 4 and 5 are cross-sectional and perspective views, respectively, of a smart conduit plug 180 in accordance with another embodiment of the present invention. As shown, conduit plug 180 may include a plurality of wrench flats. Further, in the illustrated embodiment, an LED 208 having a metal cap 220 and glassed header 222 is provided as a subassembly with solder pins 224 extending from the glassed header 222 to printed circuit board 206. The metal cap 220 is then welded or brazed to the metal conduit plug body at interface 226. LED(s) 208 is/are configured to direct light through glass 210 to provide one or more visual indications relative to the field device. As shown in FIG. 4, components or logic chip(s) 228 are disposed on surface 230 of printed circuit board 206. Components 228 may include a simple integrated circuit that drives the state of LED(s) 208 based on field device status. Further, logic chips/components 228 could also include a small microcontroller that is configured to provide additional indications relative to the field device. While chips/components 228 are only shown on surface 230, it is expressly contemplated that additional components could be disposed on the opposite side of printed circuit board 206. Wires or connectors 212 extend from printed circuit board 206 to field device wiring, such as a terminal block (not shown). The printed circuit board 206 may be attached to the conduit plug body 200 in any suitable manner including, without limitation, epoxy, solder, or mechanically (e.g., using a clip). Note, in embodiments that simply require an LED driven off analog power of the field device, printed circuit board 206 may be omitted.

Figure 6:
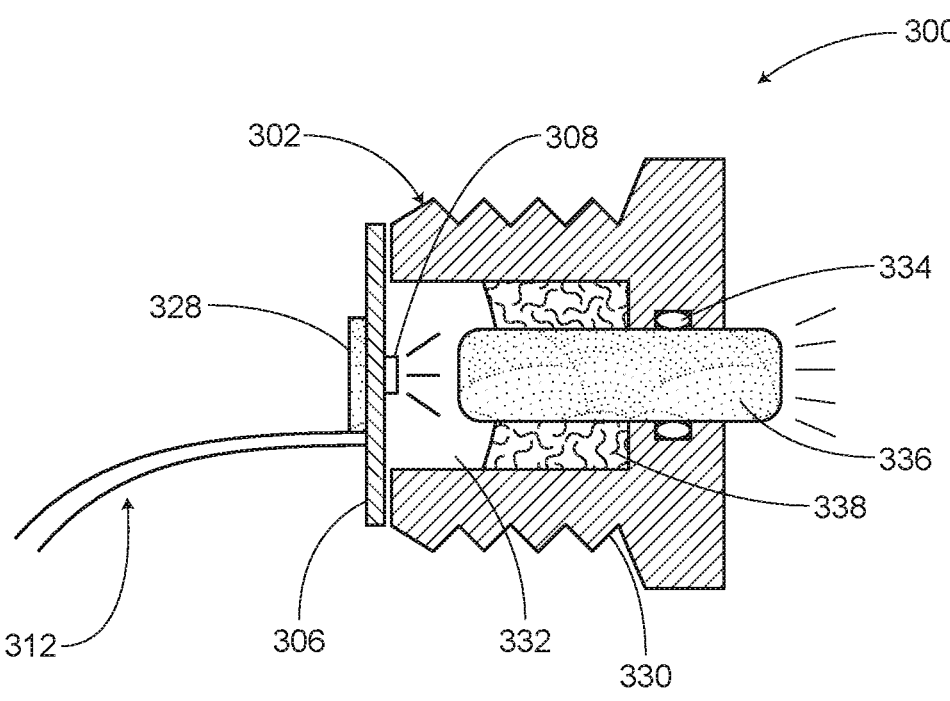
FIGS. 6 and 7 are cross sectional and perspective views, respectively, of a smart conduit plug in accordance with another embodiment of the present invention.
Figure 7:
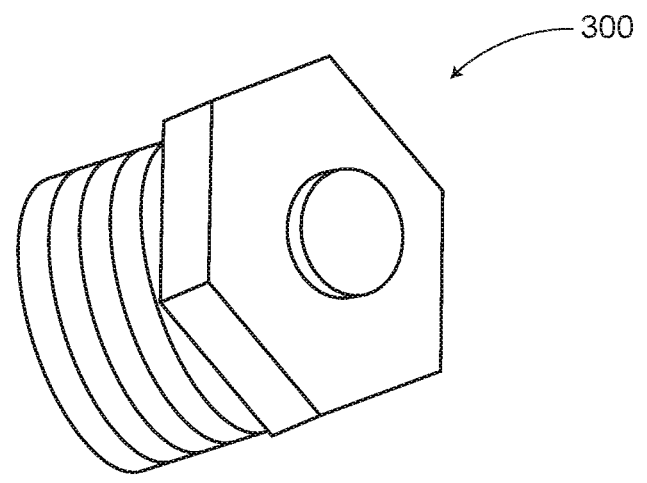

FIGS. 6 and 7 are cross-sectional and perspective views, respectively, of a smart conduit plug 300 in accordance with another embodiment of the present invention. As shown in FIG. 6, smart conduit plug 300 includes a conduit plug body 302 having an externally threaded portion 330, a chamber 332, and a plurality of wrench flats. Smart conduit plug 300 uses a potted design with an o-ring 334 between conduit plug body 302 and glass pipe 336. Potting 338 mounts glass pipe 336 within chamber 332 and conducts illumination from LED 308 to an external area 337. Potting 338 is dispensed into chamber 332 and, along with o-ring 336, creates the environmental seal. Potting is required along the length of glass pipe 336 to generate a sufficient flameproof seal. Printed circuit board 306 is attached to conduit plug body 302 in any suitable manner including via epoxy, solder (depending on material selection), or via ultrasonic welding or held-in-place plastics anchored to the conduit plug body 302 or in potting 338. As shown in FIG. 6, one or more LEDs 308 are disposed on printed circuit board 306 and configured to generate light in the direction of glass pipe 336. One or more electrical components 328 are disposed on the opposite side of printed circuit board 306 from LEDs 308. A plurality of wires or connectors 312 extend from printed circuit board 306 to field device wiring (not shown).

While embodiments described above have generally provided an LED that provides an indication relative to the field device, it is expressly contemplated that embodiments can include additional components on the printed circuit board to provide additional functions. For example, a humidity sensor on the printed circuit board can be used to detect humidity within the field device housing and the visual indication provided by the one or more LEDs could include an indication of moisture levels inside the field device housing. In another example, an alarm could be tripped if moisture content significantly increases; a condition that generally leads to failure. In still another example, a vibration sensor/accelerometer is mounted to the printed circuit board of the smart conduit plug and provides an alert if the field device and therefore its install point, is experiencing significant vibration. In another example, an early warning wet/corrosive terminal block detector can be provided to sense a wet/corrosive terminal block and provide an indication thereof. Additionally, while indications have been described with respect to driving the one or more LEDs to display different colors it is also expressly contemplated that the one or more LED may also convey visual information via flashing codes instead of or in combination with the changing colors.

Additional features that can be included in the smart plug in accordance with the various embodiments described above include the provision of an audio indication within the field device to indicate status and/or convey alarms. An RF antenna can be disposed in the smart conduit plug to provide an RF pathway through the glass in what is otherwise an enclosed metal field device housing. The RF antenna could be configured for any suitable RF communication, but in one particular embodiment is a Bluetooth Low Energy (BLE) antenna. In still another embodiment, a small LCD is mounted to the printed circuit board of the smart conduit plug and viewable through the glass. The small LCD may also include a backlight to enhance viewability and/or provide additional visual indications (e.g., via color or flash codes).

Figure 8:
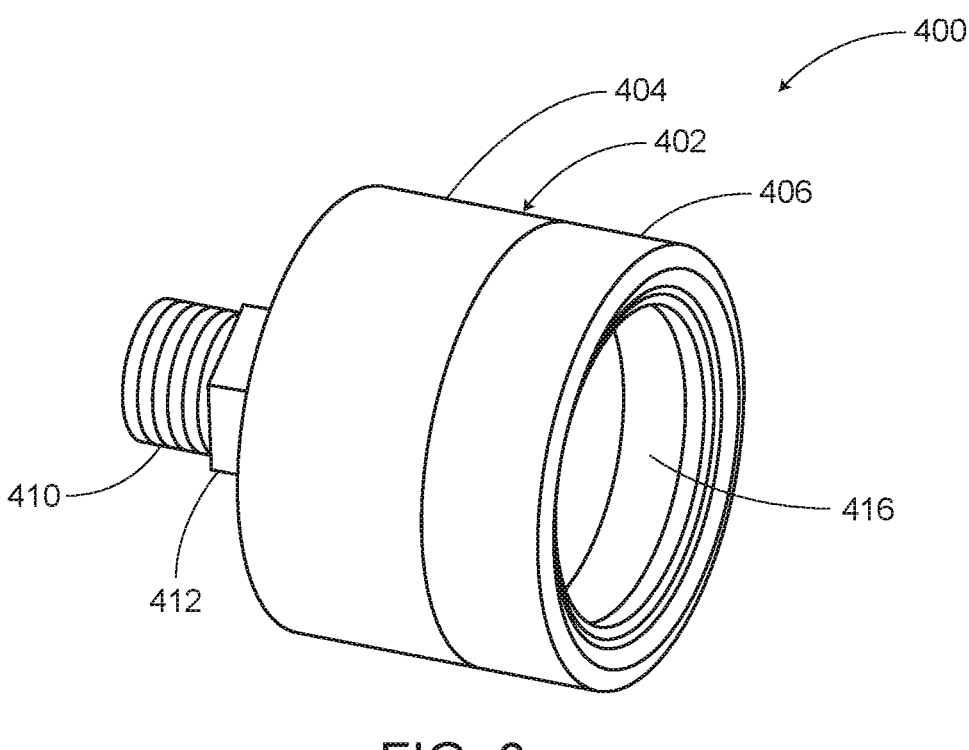
FIGS. 8 and 9 are diagrammatic perspective and cross-sectional views of a smart conduit plug in accordance with another embodiment of the present invention.
Figure 9:
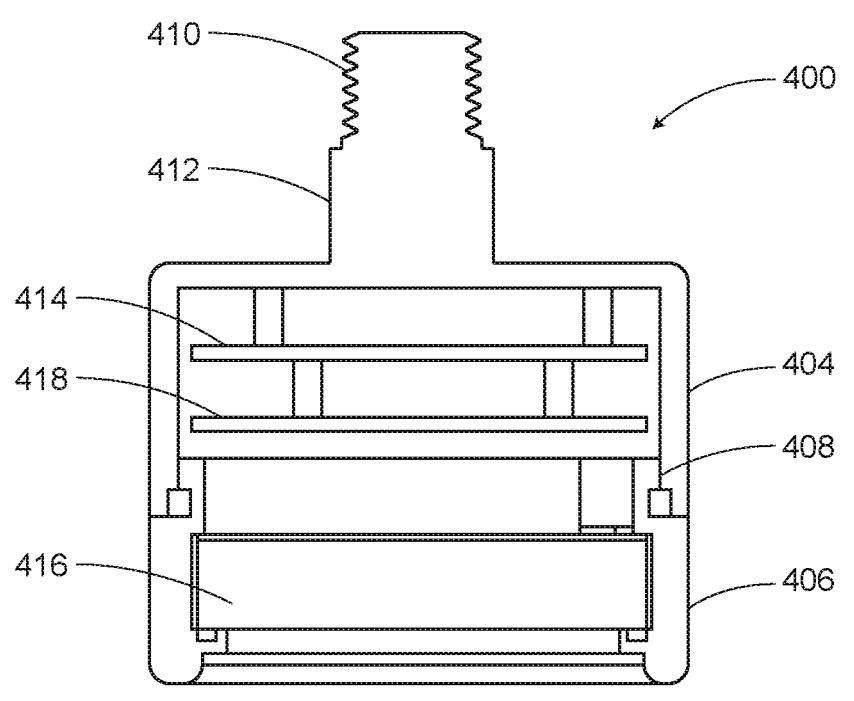

FIGS. 8 and 9 are diagrammatic perspective and cross-sectional views of a smart conduit plug in accordance with another embodiment of the present invention. Smart conduit plug 400 includes a housing 402 that is preferably formed of two parts 404, 406 which engage one another at interface 408 to provide an explosion-proof housing. Such engagement may be via a threaded engagement, slip fit, weld, press fit, and/or heat-shrink. Housing 402 also includes external NPT threads 410 that are configured to thread into a conduit of a field device. A hex bolt 412 is attached to threads 410 such that a technician can use a wrench or other suitable tool to threadably engage NPT threads 410 into the conduit of the field device 28.

As shown in FIG. 9, smart conduit plug 400 includes at least one printed circuit board 414 that may contain any or all of the circuitry components described above. The printed circuit board 414 includes at least one LED that provides an indication of status of the device, process, or any combination thereof. In one particular example, the LED is mounted in the center of the circular circuit board 414 and arranged to display out window 416. In the example shown in FIG. 9, a shroud 418 is interposed between printed circuit board 414 and window 416. Shroud 418 includes an aperture that is aligned with the position of the LED such that illumination of the LED can pass through the aperture of shroud 418 and out window 416. However, other elements of circuit board 414 are obscured from view through window 416.

Figure 10:
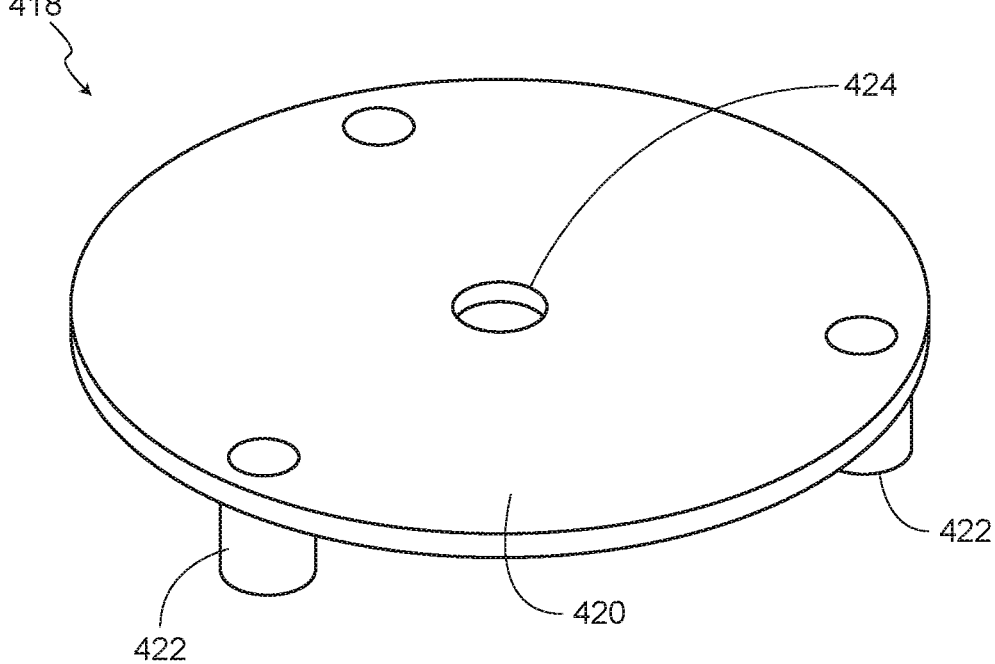
FIG. 10 is a diagrammatic perspective view of a shroud of a smart conduit plug in accordance with an embodiment of the present invention.

FIG. 10 is a diagrammatic perspective view of a shroud of a smart conduit plug in accordance with an embodiment of the present invention. Shroud 418 generally includes a circular platform 420 with a plurality of standoffs 422 extending downwardly therefrom. The standoffs 422 help generate the correct spacing between circular platform 420 and the printed circuit board 414 (shown in FIG. 9). FIG. 10 shows aperture 424 disposed in the center of circular platform 420 to allow a centrally-located LED to shine through. However, in embodiments where the LED is not located in the center of the printed circuit board, aperture 424 would be placed in a different position such that the LED could still shine through. In the illustrated example, circular platform 420 includes an opaque surface to prevent light from passing through. In some embodiments, circular platform itself could be opaque.

As shown in FIG. 10, shroud 418 may include additional features. One such feature may be the shape of shroud 418. For example, shroud 418 may be provided with a concave shape to enhance LED visibility. Additionally, shroud 418 may have or include a metallized surface to offer reflectivity and improve visibility. Shroud 418 may be designed to enclose and/or protect printed circuit board 414 (shown in FIG. 9). Shroud 418 may include one or more mechanical features to physically attach to printed circuit board 414. For example, shroud 418 may include snap features to snap to and retain printed circuit board 414. Additionally, or alternatively, shroud 418 may include one or more mechanical features to install and retain itself within housing 402. For example, shroud 418 may include snap features to install and retain into housing 402. Additionally, shroud 418 may contain overmolding for environmental protection as well as protection against high vibration.

Figure 11:
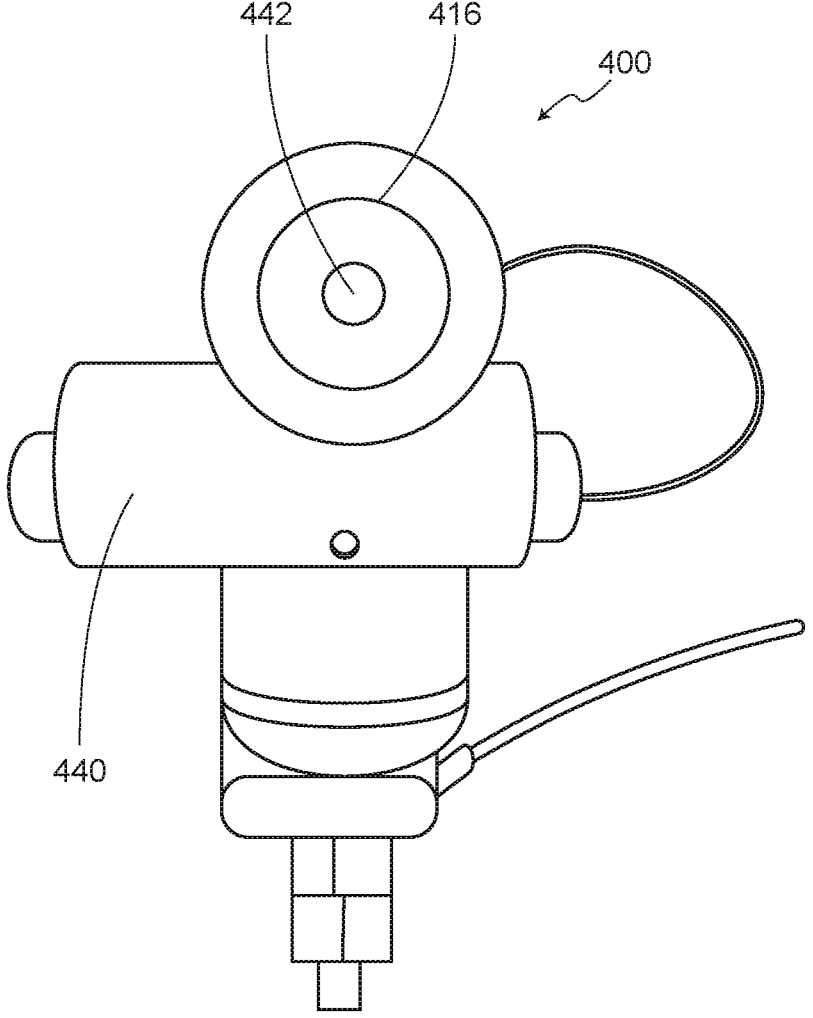
FIG. 11 is an elevation view of a smart conduit plug attached to a field device in accordance with an embodiment of the present invention.

FIG. 11 is an elevation view of a smart conduit plug attached to a field device in accordance with an embodiment of the present invention. As shown in FIG. 11, smart conduit plug 400 is attached to field device 440 and has a centrally located LED 442 showing through a window 416 of smart conduit plug 400.

Figure 12:
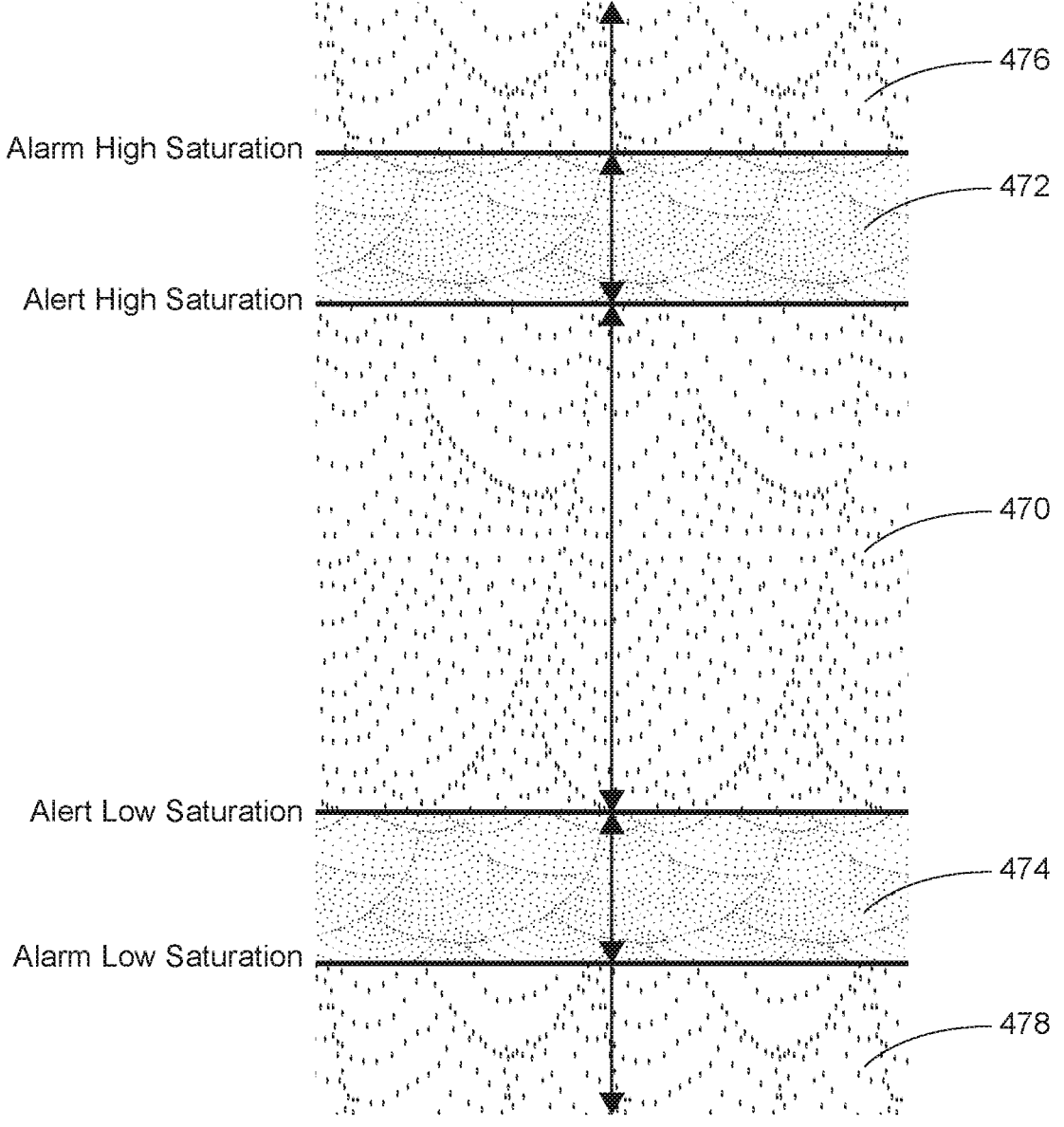
FIG. 12 is a diagrammatic view of different alarm colors (illustrated as different shades of grey) of a smart conduit plug in accordance with an embodiment of the present invention.

FIG. 12 is a diagrammatic view of different alarm colors (illustrated as different shades of grey) of a smart conduit plug in accordance with an embodiment of the present invention. In the illustrated example, when the system is in region 470, the color of the LED can be indicative of nominal operation, such as by illuminating in the color green. If the system becomes slightly above or below the nominal range, as indicated by regions 472, 474, respectively, a suitable alert, such as a saturation alert can be generated by causing the LED to illuminate in the color blue. If the system progresses further into either of regions 476, 478, an alarm can be indicated by causing the LED to illuminate in the color red. Certainly other color schemes can be employed as well as incorporating LED flashing and/or flash codes indicative of particular device or process conditions.

Figure 13A:
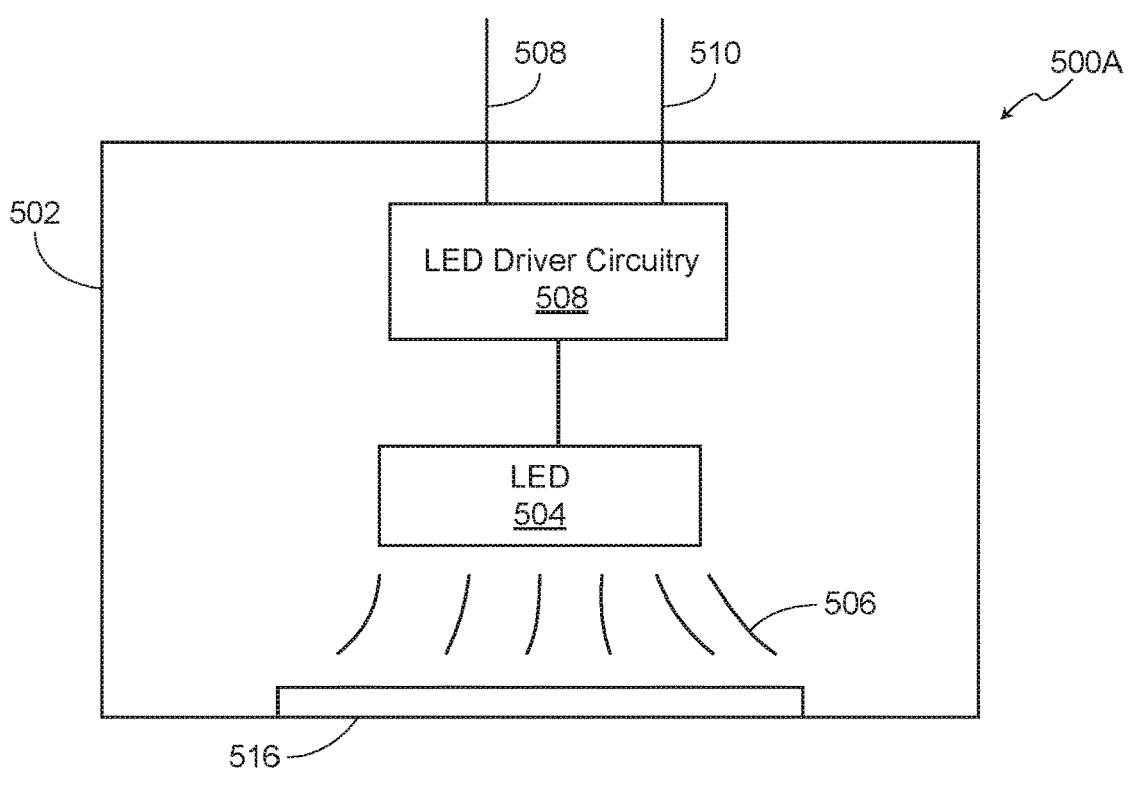
FIGS. 13A and 13B are block diagrams of smart conduit plugs in accordance with embodiments of the present invention.
Figure 13B:
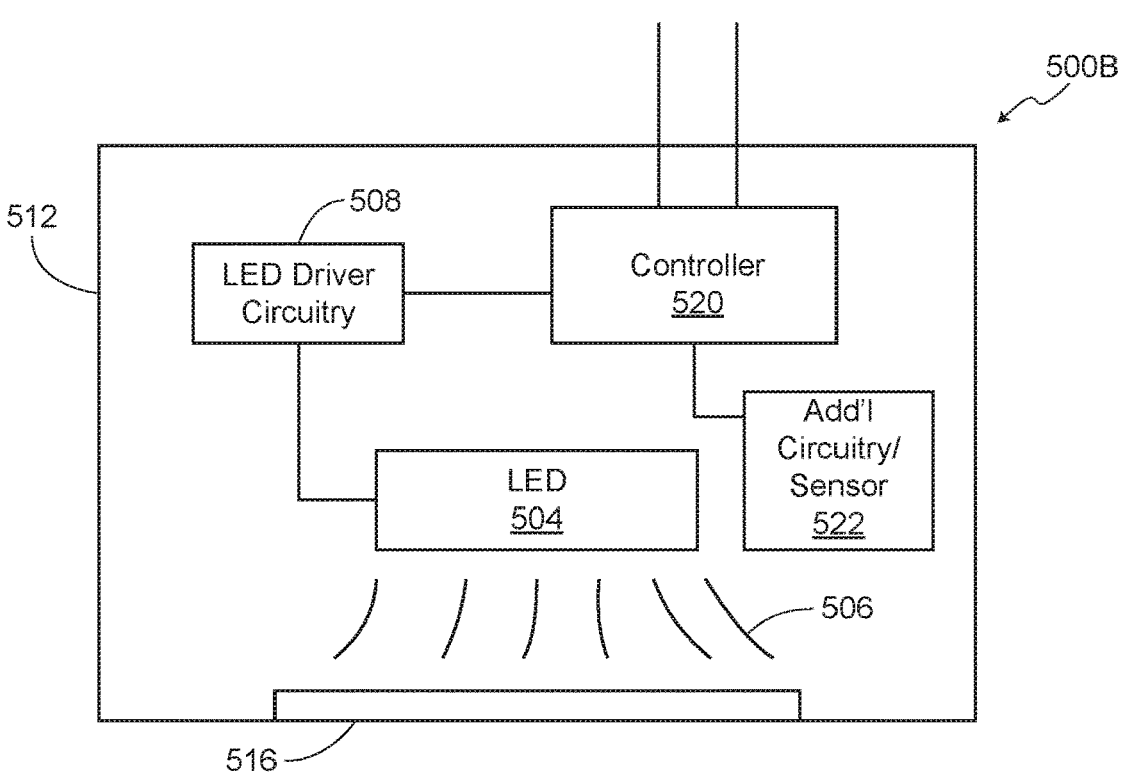

FIGS. 13A and 13B are block diagrams of smart conduit plugs in accordance with embodiments of the present invention. FIG. 13A is a block diagram of smart conduit plug 500A in accordance with an embodiment of the present invention. Plug 500A includes an LED 504 disposed within conduit plug body 502. LED 504 is mounted within conduit plug body 502 is such a way as to direct illumination 506 through window 516. LED 504 is coupled to LED driver circuitry 508 which includes suitable circuit components to power LED 504. Examples of such components include a current limiting resistor, a selectable switch that can reverse the polarity of voltage applied to LED 504 (e.g. to change colors of a multi-color LED), or flashing circuitry configured to flash the LED in order to provide additional information (such as a process alert or field device condition alarm), and/or a buck and boost converter configured to obtain power from a field device loop without affecting device operation or output. LED driver circuitry is operably coupled to a field device (not shown) typically by coupling wires 508, 510 to suitable terminals on a terminal block of the field device.

FIG. 13B is a block diagram of smart conduit plug 500B in accordance with an embodiment of the present invention. Plug 500B includes an LED 504 disposed within conduit housing 512. LED 504 is mounted within housing 512 is such a way as to direct illumination 506 through window 516. LED 504 is coupled to LED driver circuitry 508 which includes suitable circuit components to power LED 504. In smart conduit plug 500B, LED driver circuitry 508 is coupled to or included within controller 520. Controller 520 can include any suitable circuitry or logic that is able to execute a series of programmatic steps or instructions to perform one or more functions relative to smart conduit plug 500B. Controller 520 may be a microprocessor, a micro-controller, an application specific integrated circuit (ASIC), a field-programmable gate array (FPGA), or any other suitable device. In the illustrated embodiment, controller 520 is coupled to additional circuitry/sensor 522. Additional circuitry sensor 522 represents a number of additional components that can be used alone or in combination with any other circuitry/sensor components listed below.

Additional circuitry/sensor 522 can include a sensor that is configured to sense some characteristic relevant to the field device, process, or combination thereof. Such sensors can include a temperature sensor, a pressure sensor, a moisture sensor, a vibration sensor, an emf interference sensor, and/or a gas sensor. Controller 522 includes suitable internal logic to measure an electrical characteristic of the sensor (such as resistance, voltage, etc.) and calculate a parameter relative to the measured characteristic. Then, controller 522 is able to drive LED 502 to provide an indication of the measured characteristic.

Additional circuitry/sensor 522 can also include a user display, such as an LED display, LCD display, or e-ink display. Controller 520 can drive the display to provide a display output relative to the process condition, the field device condition or a combination thereof. Additionally, in embodiments where additional circuitry 522 includes one or more sensors and a display, the display can provide information about the sensed characteristics.

Additional circuitry/sensor 522 can also include wireless communication circuitry to allow controller 520 to communicate with a remote device and/or the field device itself. The wireless communication circuitry can be configured to communicate in accordance with Bluetooth (such as Bluetooth Low Energy—BLE), Wifi (IEEE 802.11), Cellular (such as GPRS or TDMA), RFID, satellite communication, et cetera.

Additional circuitry/sensor 522 can also include current measurement circuitry configured to measure current consumed by the field device. By measuring the current consumed by the field device, the smart conduit plug 500B may receive process variable information (i.e., via a 4-20 mA current loop) and this information can be provided locally via a display and/or remotely via wireless communication. This current consumption can be tracked by controller 520 over time in order to provide an indication of field device health.

Additional circuitry/sensor 522 can also include energy harvesting circuitry. Such circuitry can include a photoelectric array (e.g. solar cell), a kinetic energy harvester that converts mechanical energy, such as vibration, into electricity, a thermoelectric harvester, such as a Peltier device or thermocouple, or others. In some embodiments, the harvesting circuitry may provide all requisite electrical energy to power the smart conduit plug.

Additional circuitry/sensor 522 may also include on or more user input buttons. These buttons can be employed for a variety of purposes. For example, a user input button may cause the smart conduit plug to awaken from a low-power state and provide its information. This may be particularly useful in very low power applications where the smart conduit plug must rely on a very restrictive power budget such as when operating solely from energy harvested from its environment. In another example, the user input button may allow the smart conduit plug to transition between a plurality of different states or provide different types of information. In still another example, the user input button may allow a user to cause the smart conduit plug to perform some activity or cause an effect on the connected field device without having to open the cover of the field device. Such activities may include resetting the field device, causing the field device to enter a diagnostics state, causing the field device to enter a commissioning state, or any other suitable change.

Additional circuitry/sensor 522 can also include an energy storage device, such as a battery or capacitor. In embodiments wherein the energy storage device is a battery, it may be a primary battery (i.e., non-rechargeable) or a secondary battery (rechargeable).

Although the present invention has been described with reference to preferred embodiments, workers skilled in the art will recognize that changes may be made in form and detail without departing from the spirit and scope of the invention.

What is claimed is:

1. A smart conduit plug comprising:
   a plug body having an externally threaded region, the plug body having a diameter and thread pitch to engage a conduit port of a field device;
   at least one electrical component mounted relative to the plug body and configured to electrically couple to a field device and provide an indication relative to the field device.

2. The smart conduit plug of claim 1, wherein the at least one electrical component includes a light emitting diode.

3. The smart conduit plug of claim 2, wherein the indication is selected from the group consisting of: power status, normal operation, an alarm state, a fault, and field device health.

4. The smart conduit plug of claim 1, wherein the smart conduit plug is configured to maintain an explosion-proof rating of the field device when the smart conduit plug is coupled to the conduit port of the field device.

5. The smart conduit plug of claim 1, and further comprising at least one sensor disposed on a printed circuit board of the smart conduit plug, wherein the at least one sensor is configured to sense a condition relative to the field device and wherein the indication provide by the smart conduit plug is based on the sensed condition.

6. The smart conduit plug of claim 5, wherein the sensor is a moisture sensor.

7. The smart conduit plug of claim 5, wherein the sensor is a vibration sensor.

8. The smart conduit plug of claim 1, wherein the at least one electrical component is configured to provide the indication as an audio indication.

9. The smart conduit plug of claim 1, wherein the at least one component includes an RF antenna.

10. The smart conduit plug of claim 1, wherein the at least one component includes an LCD display.

11. A conduit plug comprising:
    a housing having an externally threaded region, the externally threaded region having a diameter and thread pitch to engage a conduit port of a field device; and
    at least one electrical component mounted within the housing and configured to electrically couple to the field device and provide an indication relative to the field device.

12. The conduit plug of claim 11, wherein the housing is formed of two parts that threadably engage one another.

13. The conduit plug of claim 12, wherein the housing is explosion-proof.

14. The conduit plug of claim 11 and further comprising a glass window through which the indication relative to the field device is visible.

15. The conduit plug of claim 14, wherein the at least one electrical component includes an LED.

16. The conduit plug of claim 15, and further comprising a shroud disposed within the housing and interposed between the LED and the glass window.

17. The conduit plug of claim 16, wherein the shroud is circular and includes an aperture aligned with the LED to allow illumination of the LED to pass through the shroud to the window.

18. The conduit plug of claim 17, wherein the shroud includes a plurality of standoffs to generate a spacing between the shroud and a printed circuit board mounting the at least one electrical component.

19. The conduit plug of claim 11, and further comprising a controller operably couplable to the field device, the controller being configured to generate the indication relative to the field device.

20. The conduit plug of claim 19, and further comprising a sensor disposed within the housing and coupled to the controller.

21. The conduit plug of claim 19, and further comprising at least one additional circuit disposed within the housing and coupled to the controller.

\* \* \* \* \*